(12) United States Patent
Feng et al.

(10) Patent No.: US 6,774,670 B1
(45) Date of Patent: Aug. 10, 2004

(54) INTRA-TILE BUFFER SYSTEM FOR A FIELD PROGRAMMABLE GATE ARRAY

(75) Inventors: Sheng Feng, Cupertino, CA (US); Tong Liu, San Jose, CA (US); Jung-Cheun Lien, San Jose, CA (US)

(73) Assignee: Actel Corporation, Mountain View, CA (US)

(*) Notice: Subject to any disclaimer, the term of this patent is extended or adjusted under 35 U.S.C. 154(b) by 19 days.

(21) Appl. No.: 10/334,340

(22) Filed: Dec. 30, 2002

(51) Int. Cl.[7] .................................................. H03K 19/177
(52) U.S. Cl. ........................ 326/41; 326/39; 326/47
(58) Field of Search .............................. 326/38–41, 47

(56) References Cited

U.S. PATENT DOCUMENTS

| | | | | |
|---|---|---|---|---|
| 5,323,069 | A | * 6/1994 | Smith, Jr. ................. | 326/47 |
| 5,451,887 | A | 9/1995 | El-Avat et al. ............. | 326/39 |
| 5,477,165 | A | 12/1995 | ElAyat et al. .............. | 326/38 |
| 5,570,041 | A | 10/1996 | El-Avat et al. ............. | 326/41 |
| 5,606,267 | A | 2/1997 | El Ayat et al. ............. | 326/41 |
| 5,625,301 | A | 4/1997 | Plants et al. .............. | 326/41 |
| 5,698,992 | A | 12/1997 | El Ayat et al. ............. | 326/41 |
| 6,211,697 | B1 | 4/2001 | Lien et al. ................ | 326/41 |
| 6,292,021 | B1 | * 9/2001 | Furtek et al. .............. | 326/41 |
| 6,301,696 | B1 | 10/2001 | Lien et al. ................ | 716/16 |
| 6,446,242 | B1 | 9/2002 | Lien et al. ................ | 716/6 |
| 6,476,636 | B1 | 11/2002 | Lien et al. ................ | 326/41 |
| 6,504,398 | B1 | 1/2003 | Lien et al. ................ | 326/41 |
| 6,531,891 | B1 | 3/2003 | Sun et al. ................. | 326/41 |
| 6,611,153 | B1 | * 8/2003 | Lien et al. ................ | 326/41 |

* cited by examiner

Primary Examiner—Anh Q. Tran
(74) Attorney, Agent, or Firm—Sierra Patent Group, Ltd.

(57) ABSTRACT

The invention relates to an intra-tile buffering system for a field programmable gate array. The field programmable gate array comprises a field programmable gate array tile comprising a number of rows and a number of columns. Each row has a left end and a right end, and each column has a top end and a bottom end. Each row comprises a plurality of functional groups with an interface group located at said right end and said left end. Each column comprises a plurality of functional groups with an interface group located at said top end and said bottom end. A primary routing structure is coupled to said functional groups and interface groups and configured to receive primary output signals, route primary output signals within said at least one field programmable gate array tile, and provide primary input signals to said functional groups and interface groups. Each functional group is configured to receive a primary input signal, perform a logic operation, and generate a primary output signal. Each interface group is configured to transfer signals from said primary routing structure to outside of said at least one field programmable gate array tile, and includes a plurality of input multiplexers configured to select signals received from outside of said at least one field programmable gate array tile and provide signals to the primary routing structure inside said at least one field programmable gate array tile. Said primary routing structure comprises a horizontal bus coupled to each row of functional groups, a vertical bus coupled to each column of functional groups, a horizontal buffer coupled to each horizontal bus and spaced every Nth column of functional groups, where N is an integer, and a vertical buffer coupled to each horizontal bus and spaced every Mth row of functional groups, where M is an integer.

22 Claims, 12 Drawing Sheets

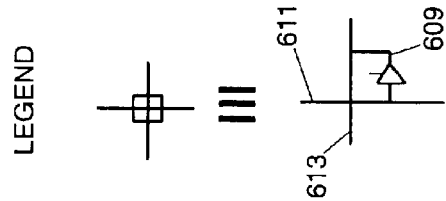
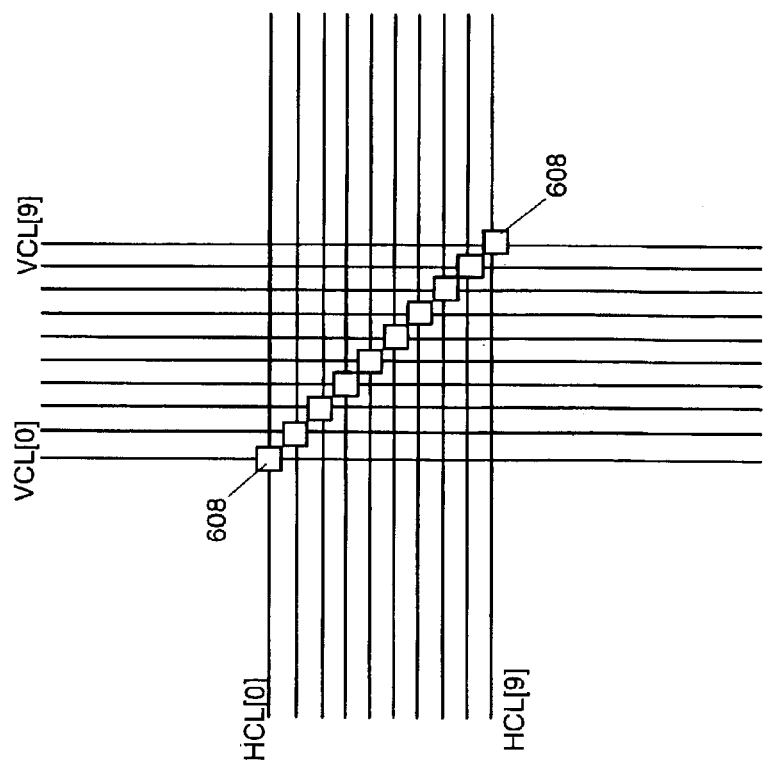

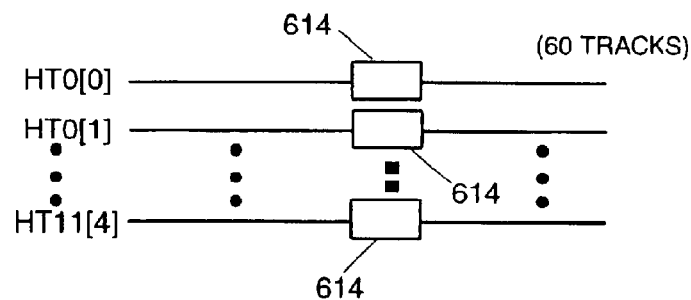
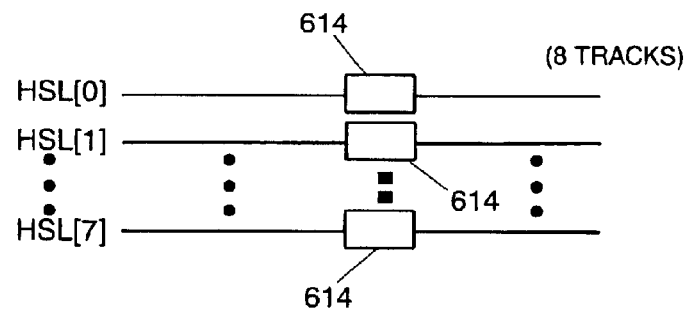
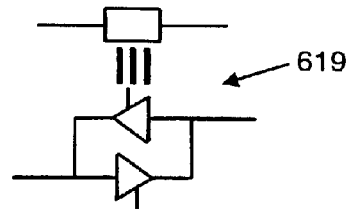
FIG.10B
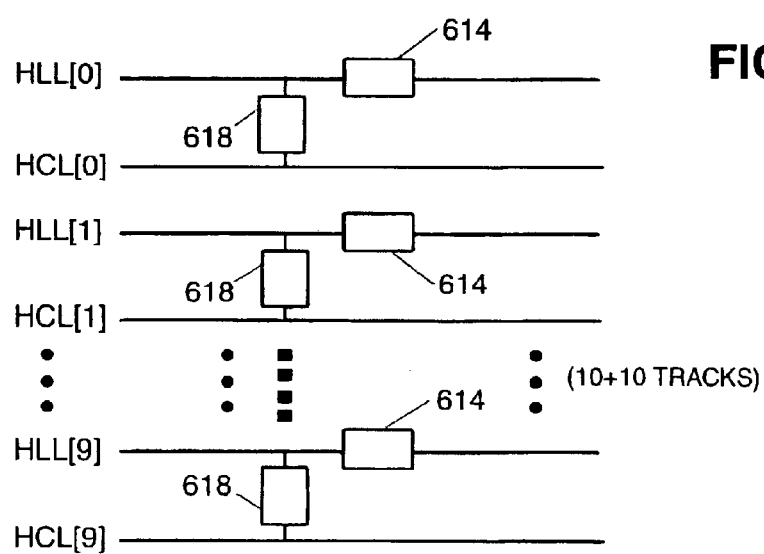
FIG. 10A

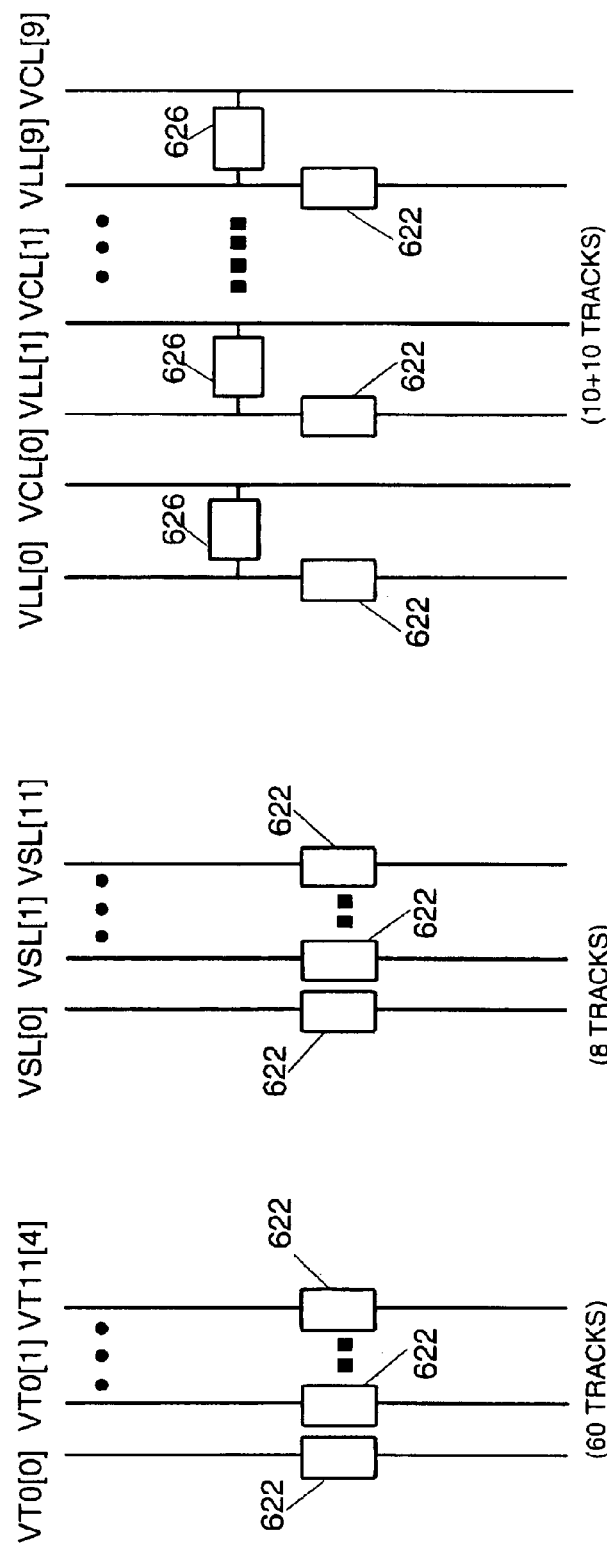
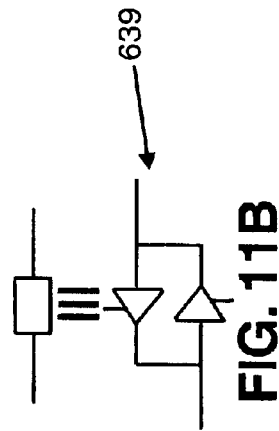
FIG. 11A
FIG. 11B

INTRA-TILE BUFFER SYSTEM FOR A FIELD PROGRAMMABLE GATE ARRAY

BACKGROUND OF THE INVENTION

1. Field of the Invention

The present disclosed system relates to field-programmable gate arrays (FPGAs), and more particularly, to a field programmable gate array (FPGA) tile intra-tile buffer system.

2. Description of the Related Art

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing Boolean functions of a few variables. The cell types are not restricted to gates. For example, configurable functional groups ("FGs") typically include memory cells and connection transistors that may be used to configure logic functions such as addition, subtraction, etc., inside of the FPGA. A cell may also contain at least one flip-flop. Some types of logic cells found in FPGAs are those based on multiplexers and those based on programmable read only memory (PROM) table-lookup memories. Erasable FPGAs can be reprogrammed repeatedly. This technology is convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors.

The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches or program the shift registers for anti-fuse type switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are flexible devices that are capable of implementing many different functions, and as such, they include excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC that makes the ASIC a smaller device. An ASIC, on the other hand, is not a flexible device. In other words, once an ASIC has been manufactured it cannot be reconfigured to perform a different function, which is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

BRIEF SUMMARY OF THE INVENTION

The invention relates to an intra-tile buffering system for a field programmable gate array. The field programmable gate array comprises a field programmable gate array tile comprising a number of rows and a number of columns. Each row has a left end and a right end, and each column has a top end and a bottom end. Each row comprises a plurality of functional groups with an interface group located at said right end and said left end. Each column comprises a plurality of functional groups with an interface group located at said top end and said bottom end. A primary routing structure is coupled to said functional groups and interface groups and configured to receive primary output signals, route primary output signals within said at least one field programmable gate array tile, and provide primary input signals to said functional groups and interface groups. Each functional group is configured to receive a primary input signal, perform a logic operation, and generate a primary output signal. Each interface group is configured to transfer signals from said primary routing structure to outside of said at least one field programmable gate array tile, and includes a plurality of input multiplexers configured to select signals received from outside of said at least one field programmable gate array tile and provide signals to the primary routing structure inside said at least one field programmable gate array tile. Said primary routing structure comprises a horizontal bus coupled to each row of functional groups, a vertical bus coupled to each column of functional groups, a horizontal buffer coupled to each horizontal bus and spaced every Nth column of functional groups, where N is an integer, and a vertical buffer coupled to each horizontal bus and spaced every Mth row of functional groups, where M is an integer.

A better understanding of the features and advantages of the present disclosed system will be obtained by reference to the following detailed description of the disclosed system and accompanying drawings which set forth an illustrative embodiment in which the principles of the disclosed system are utilized.

BRIEF DESCRIPTION OF THE DRAWINGS

FIGS. 9a and 9b are schematics illustrating the programmable interconnectors comprising the CL turn areas.

FIGS. 10a and 10b are schematics illustrating the intra-tile horizontal buffers.

FIGS. 11a and 11b are schematics illustrating the intra-tile vertical buffers.

DETAILED DESCRIPTION OF THE INVENTION

Figure 1:
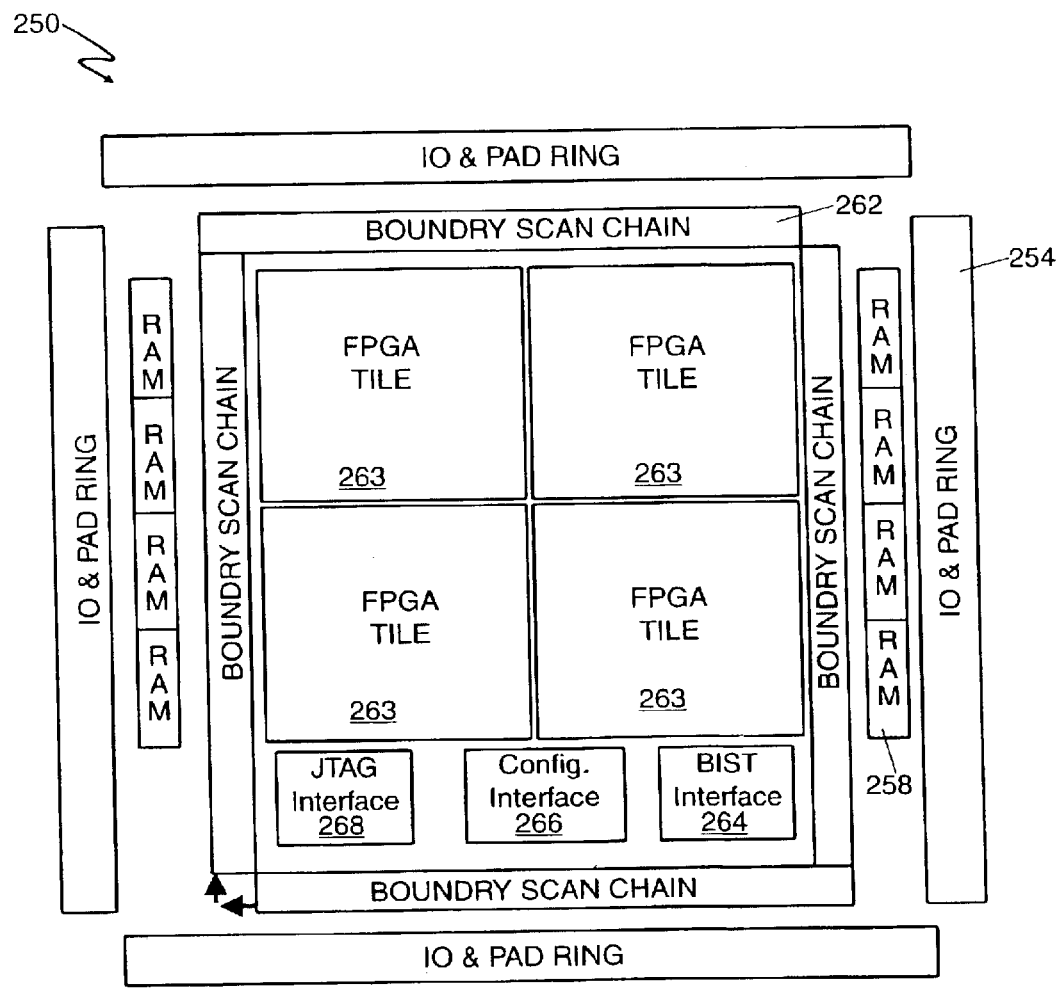
FIG. 1 is a schematic illustrating a field programmable gate array.

In FIG. 1, an overall view of one embodiment of the disclosed system is shown. Field-programmable gate array (FPGA) 250 has IO & PAD ring 254 on the outer perimeter. RAM blocks 258 are between IO & PAD ring 254 and boundary scan chains 262. Circuitry within and including boundary scan chains 262 forms a core to which RAM may be added. This core is also easily adapted to other configurations.

In this embodiment four FPGA tiles 263 are shown arranged in a 2 by 2 matrix. Built-in self-test interface module ("BIST") 264 is adjacent to FPGA tiles 270. Configuration interface 266 is a configuration control module that receives the bitstream program into its configuration RAM. Joint test action group ("JTAG") interface 268 is a module that is an access point that allows for high-level test control.

Figure 2:
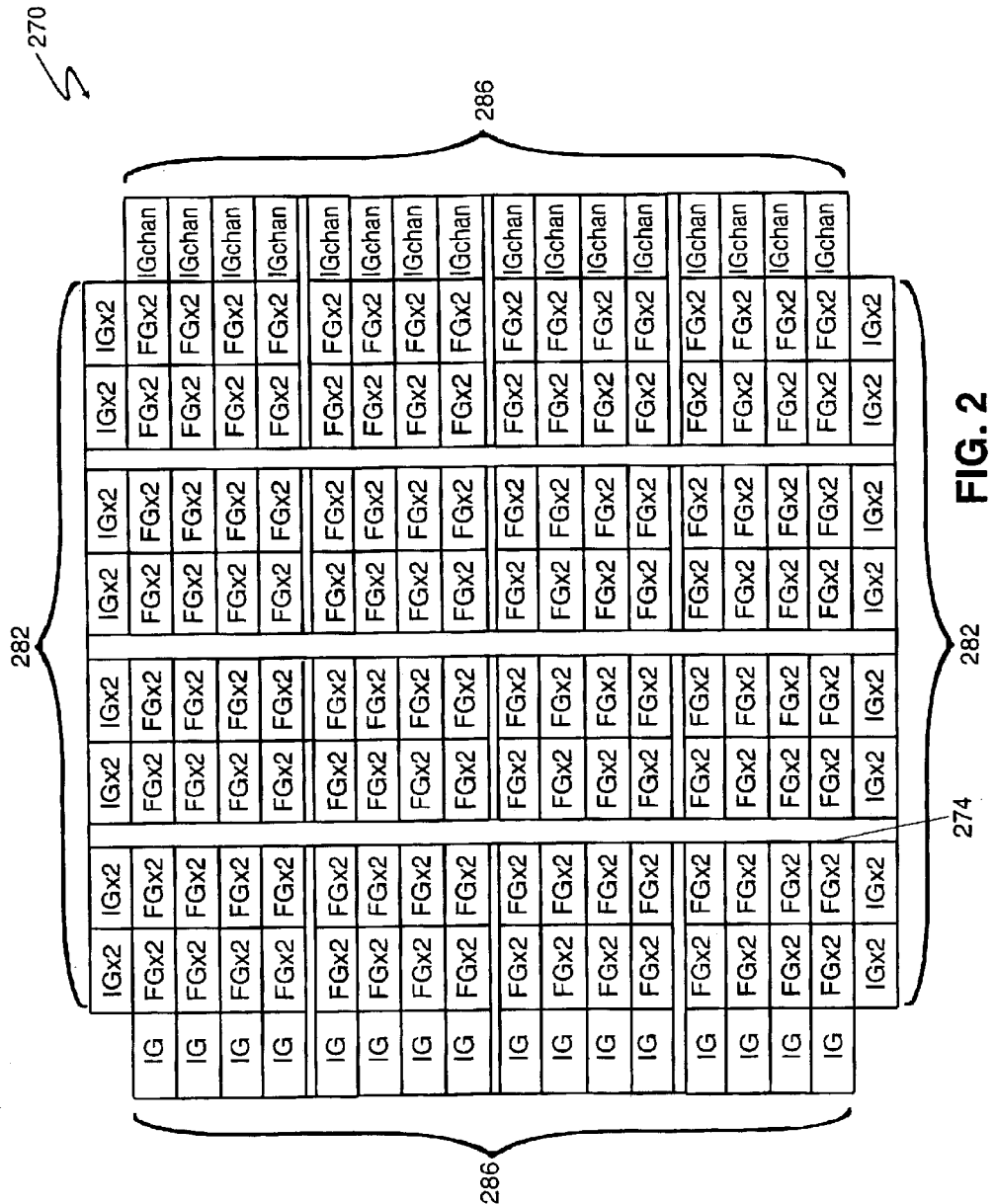
FIG. 2 is a schematic illustrating a more detailed view of one tile shown in FIG. 1.

FIG. 2 is a schematic illustrating a more detailed view of one FPGA tile 263 from FIG. 1. In one embodiment, each FPGA tile is made up of a plurality of pairs of functional groups (FGs—each pair referred to as a "FGx2") 274 arranged in a side-by-side manner. FGs are small multifunction circuits that are capable of realizing many Boolean functions. The FGs include look-up tables (LUTs) and other circuits capable of realizing Boolean functions, as well as memory cells that are used to configure logic functions such as addition, subtraction, etc.

Still referring to FIG. 2, in one embodiment FGx2s 274 are arranged in a 16 by 8 array of FGx2s. Since an FGx2 is a pair of side FGs, then this array is equivalent to a 16 by 16 array of FGs. Each row containing 8 FGx2s comprise 16 FGs because there are 2 side by side FGs in each FGx2. Please refer to FIG. 3 for a more detailed view of FGx2 274.

Around the outer perimeter of the 16×8 FGx2 array are interface groups ("IGs") 286. IGs 286 provide an interface for FPGA tiles 270 to other FPGA tiles or devices, or to pad rings for connecting the FPGA tiles to IC package pins. In general, the logic structure of the FPGA tile is provided by the FGs and the IGs. The IGs are arranged around the FGx2 array as follows: There are two columns of IGs 286, one on the left side and one on the right side of the FGx2 array. There are two rows 282 of pairs of IGs referred to as IGx2 located on the top side and bottom side of the FGx2 array.

Also included in the FPGA tiles, but not shown in FIG. 2, are several horizontal and vertical regular routing buses, routing interconnect areas, switching transistors, and global signal distribution routing structure, all of which will be discussed below.

Figure 3:
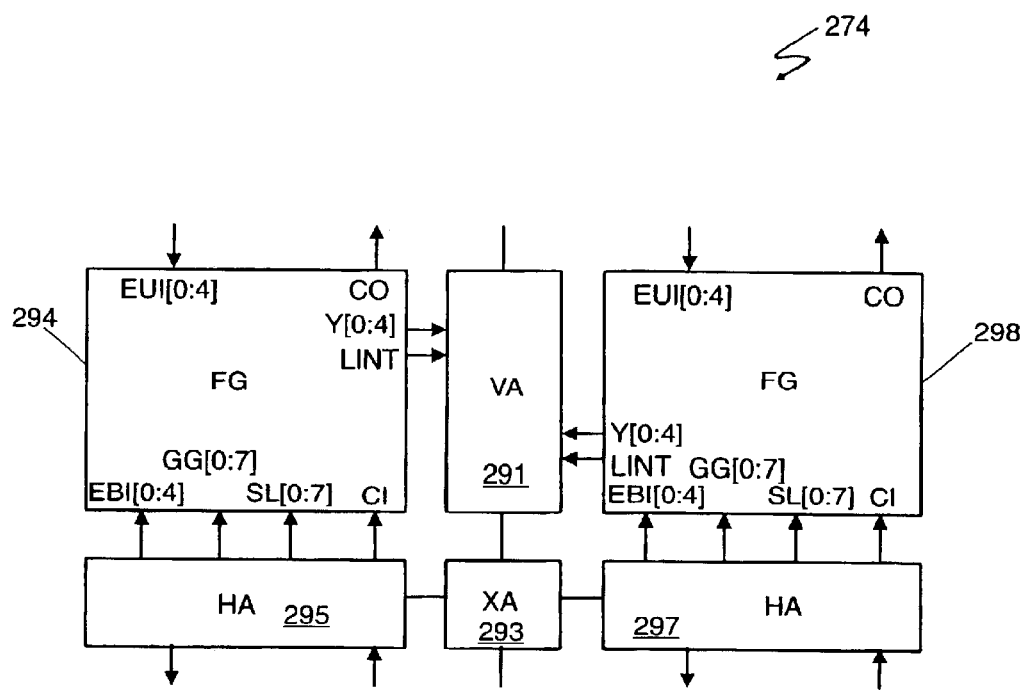
FIG. 3 is a schematic illustrating a detailed view of a side-by-side pair of functional groups.

FIG. 3 illustrates a more detailed view of FGx2 274. Two FGs 294 and 298 comprise FGx2 274. Each of FGs 294 and 298 are configured to receive inputs from the following routing resources: EUI[0:4], EBI[0:4], GG[0:7], SL[0:7] and CI. Both of FGs 294 and 298 are also configured to send outputs through the following resources: CO, Y[0:4], and LINT ports. The LINT ports carry a secondary routing signal. Between FGs 294 and 298 is a vertical channel containing vertical bus VA 291 which carries the following routing resources: VT[0:11] [0:4], VSL[0:7], VLL[0:9], and VCL[0:9]. The convention of [0:11] [0:4] means that there are 12 (0 through 11) sets of 5 (0 through 4) routing resources. Adjacent to VA bus 291 is cross bus XA 293. The routing within XA 293 is described in detail in FIG. 10. Horizontal busses HA 295 and 297 carry the following routing resources: HT[0:11] [0:4], HSL[0:7], HLL[0:9], HCL[0:9], and HFT[0:41].

Figure 4:
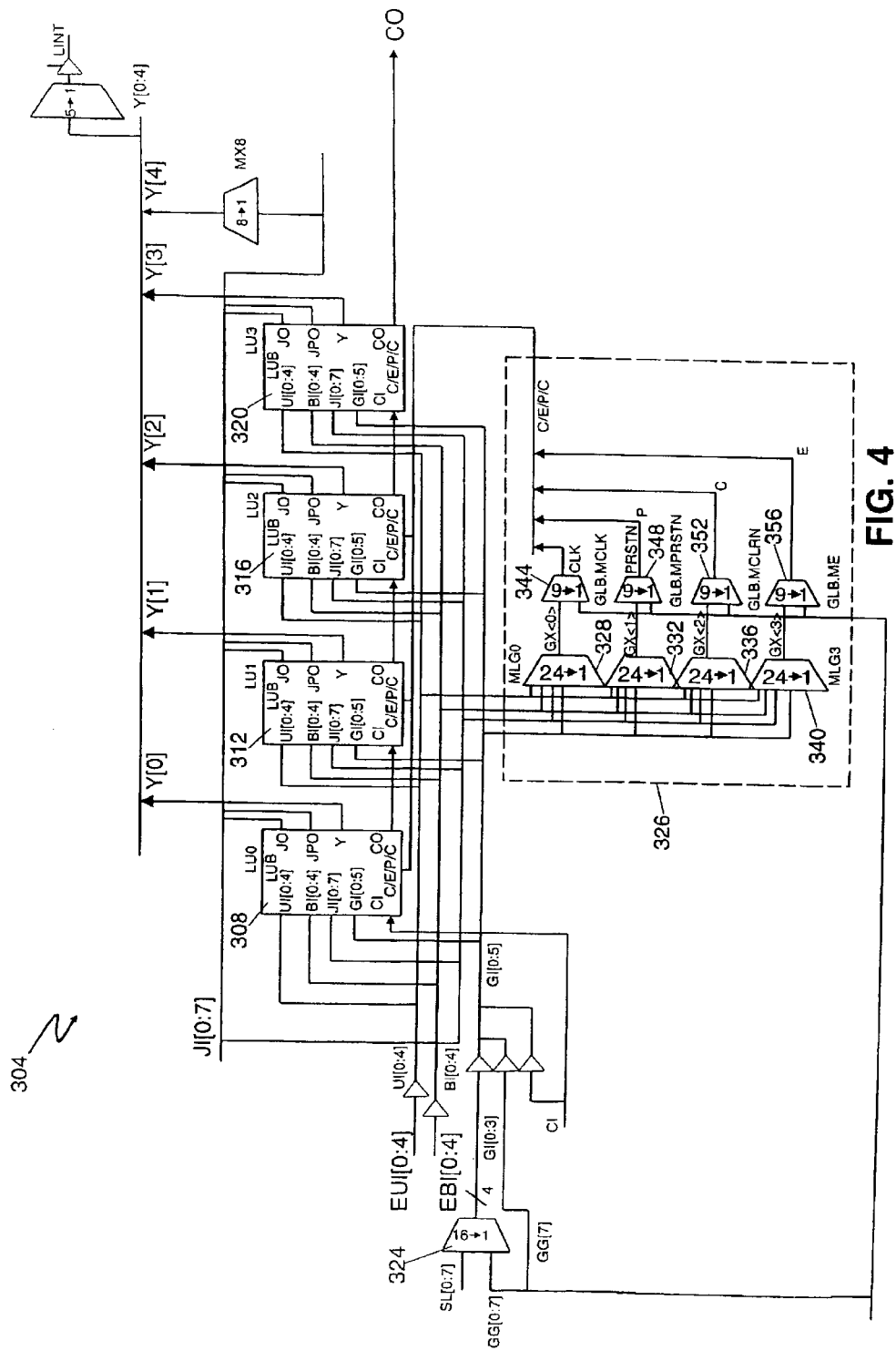
FIG. 4 is a schematic illustrating a detailed view the inner components and connections of a functional group.

FIG. 4 illustrates a schematic providing a more detailed view of FGs from FIG. 3. Each FG 304 may include four logic units ("LUBs") 308, 312, 316, 320. Each LUB is coupled to routing resource Y[0] through Y[3] respectively.

LUBs is 308, 312, 316 and 320 provide Boolean functions and logic operations of FG 304. Each of the LUBs 308, 312, 316 and 320 includes several inputs on which Boolean functions and logic operations are performed. As shown, each of LUBs 308, 312, 316 and 320 includes twenty-four such inputs (not including the CI routing resource), but it should be understood that the number of inputs may vary in accordance with the invention. Specifically, each of LUBs 308, 312, 316 and 320 receives signals through input ports UI[0:4] and BI[0:4] which correspond to signals received through regular input ports EUI[0:4] and EBI[0:4]. Also, each of LUBs 308, 312, 316 and 320 receives signals through input ports GI[0:5] and JI[0:7]. The input signals via input port JI[0:7] include two output signals JO and JPO from each of LUBs 308, 312, 316 and 320. Thus, two output signals JO and JBO of each of LUBs 308, 312, 316 and 320 are fed back to the inputs by way of JI[0:7].

Input signals GI[0:5] are selected from the SL[0:7] and GG[0:7] routing resources. Sixteen-to-one multiplexer 324 selects one of the inputs from routing resources SL[0:7] and GG[0:7] and makes four copies of the selected input, as indicated by the slash "/" and associated number "4". Thus the routing resource GI[0:3] is shown exiting multiplexer 324. Routing resource GG[7] and CI are added to the GI[0:3] bus, thereby forming a GI[0:5] bus.

Each of LUBs 308, 312, 316 and 320 also includes a clock/enable/preset/clear ("C/E/P/C") input. The C/E/P/C input is used to control a flip-flop included inside each of LUBs 308, 312, 316 and 320. The C/E/P/C input signal is generated by selection circuitry, shown in the dashed lines of box 326. The C/E/P/C selection circuitry receives inputs UI[0:4], BI[0:4], JI[0:7], and GI[0:5] at each of twenty-four-to-one multiplexers 328, 332, 336 and 340. Each multiplexer 328, 332, 336 and 340 selects one signal from buses UI[0:4], BI[0:4], JI[0:7], and GI[0:5]. Each signal selected by each multiplexer 328, 332, 336 and 340 is sent to nine-to-one multiplexers 344, 348, 352, and 356 via routing resources GX[0], GX[1], GX[2], and GX[3] respectively. Each of nine-to-one multiplexers 344, 348, 352, and 356 also receives an input from the GG[0:7] routing resource. The signal selected by multiplexer 344 becomes clock signal CLK, the signal selected by multiplexer 348 becomes preset signal PRSTN ("P"), the signal selected by multiplexer 352 becomes clear signal CLRN("C"), and the signal selected by multiplexer 356 becomes enable signal E. The use of multiplexers 344, 348, 352 and 356 allows any of the signals GX[0:3], GG[0:7], and ground to be selected as one of the C/E/P/C signals.

The GG[0:7] bus is an inter-tile global bus that is coupled to every FG in all FPGA tiles. The signals in the GG[0:7] bus are often selected as the C/E/P/C signals. It should be well understood, however, that the illustrated C/E/P/C selection circuitry from FIG. 4 is just one embodiment of such a selection circuit and that various different designs of C/E/P/C selection circuit in box 326 may be used to select various different signals in accordance with the invention.

It should be understood, however, that various different designs of the circuitry discussed above may be used to select various different numbers of signals for LUBs 308, 312, 316 and 320 in accordance with the invention. In one embodiment, LUBs 308, 312, 316 and 320 are all of the same design, but in another embodiment they are not of the same design.

Figure 5:
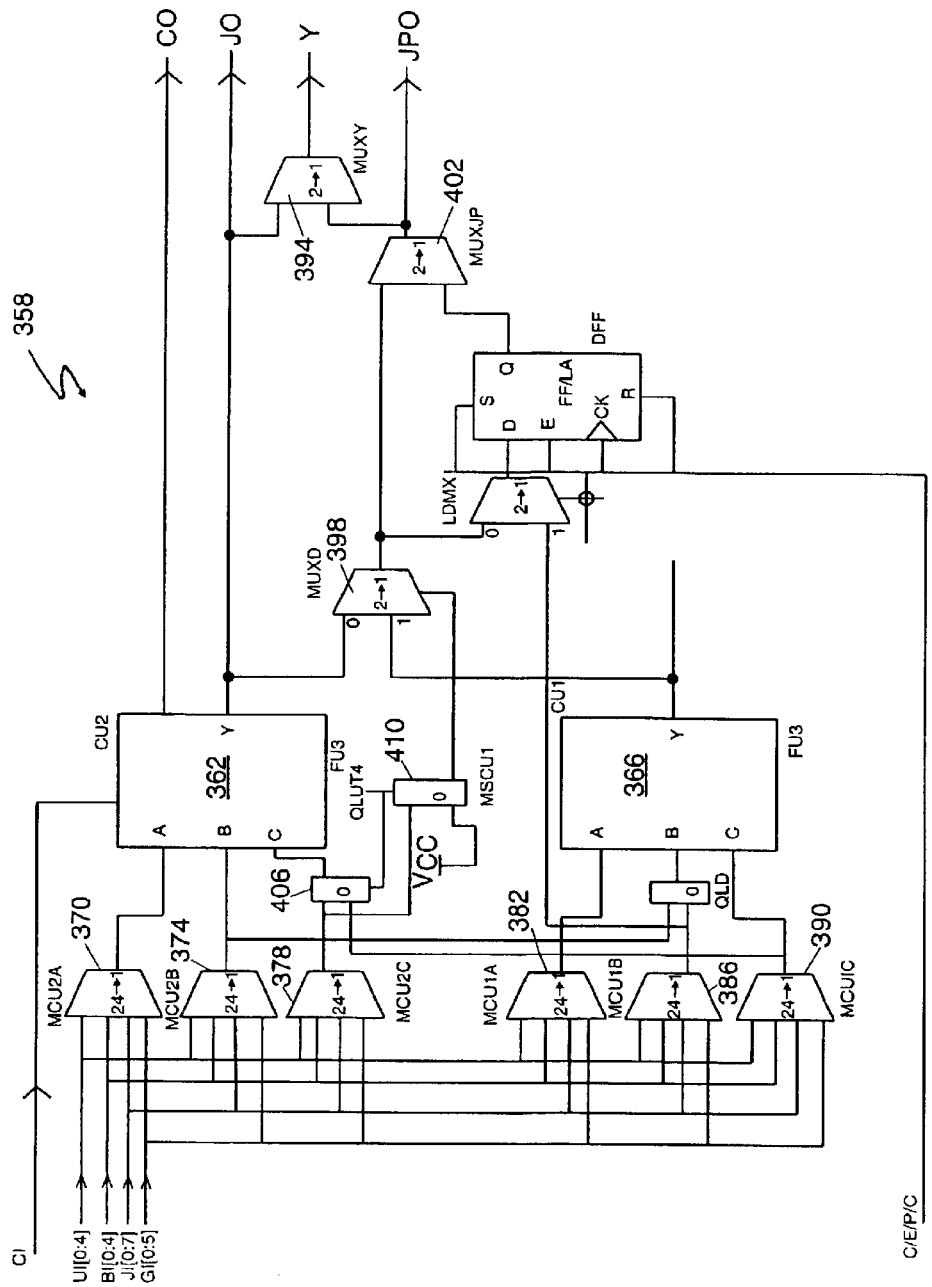
FIG. 5 is a schematic illustrating a detailed view of a look up table which comprises a functional group.

FIG. 5 illustrates a more detailed view of one of LUBs 308, 312, 316, and 320 from FIG. 4. LUB 358 includes two look-up tables ("LUTs") 362 and 366. Each LUT 362 and 366 comprises three inputs A, B, C, one output Y, and several internal memory cells (not shown). LUT 362 also comprises output CO. LUTs 362 and 366 are configured by programming internal memory cells (not shown), and the setting of the internal memory cells taken together provides a specific configuration for each of LUTs 362 and 366. Configuration data used to program the internal memory cells is generated by design software. Once a specific configuration of the internal memory cells is decided upon, inputs A, B, C may be used to generate output Y in accordance with the desired logic function.

Inputs A, B, C of the LUT 362 are provided by twenty-four-to-one multiplexers 370, 374 and 378, respectively, and inputs A, B, C of LUT 366 are provided by twenty-four-to-one multiplexers 382, 386 and 390, respectively. Each of multiplexers 370, 374, 378, 382, 386, 390 receives as inputs buses EUI[0:4], EBI[0:4], JI[0:7], and GI[0:5], comprising twenty four inputs in total. Three signals are selected from these twenty-four signals as inputs A, B, C for each of LUTs 362 and 366.

When only a three input LUT is needed, one of LUTs 362 and 364 is used. In one embodiment, LUT 362 is used while LUT 364 is not used. The Y output of LUT 362 can be sent directly to the JO output of LUB 358, or the Y output of LUT 362 can be sent to the Y output of LUB 358 by using two-to-one multiplexer 394 to select the Y output of LUT 362. Additionally, the Y output of LUT 362 can be sent to the JPO output of the LUB 358 by using two-to-one multiplexer 398 to select the Y output of the LUT 362 and two-to-one multiplexer 402 to select the output of multiplexer 398. Thus, multiplexers 394, 398 and 402 can be used to send the Y output of LUT 362 to any of the outputs Y, JO, JPO of the LUB 358.

Additionally, when two, three input LUTs are needed, LUT 362 and 366 can be used independently as three input LUTs. The Y output of LUT 362 can be sent directly to the JO output of LUB 358, or the Y output of the LUT 362 can be sent to the Y output of the LUB 358 by using two-to-one multiplexer 394 to select the Y output of LUT 362. The Y output of LUT 366 can be sent directly to the JPO output of LUB 358, or the Y output of the LUT 366 can be sent to the Y output of the LUB 358 by using two-to-one multiplexer 394 to select the output of two-to-one multiplexer 402, which can select the output of two-to-one multiplexer 398, which can select the Y output of the LUT 366.

As stated previously, one purpose of including two LUTs in the LUB is so that they can be used together to provide a four-input LUT. Specifically, the Y output of LUT 362 and the Y output of LUT 366 are connected to the inputs of two-to-one multiplexer 398. In order to simulate a single, four-input LUT, two-to-one multiplexer 406 selects the signal from twenty-four-to-one multiplexer 390 as input C to LUT 362. Two-to-one multiplexer 410 selects the signal from twenty-four-to-one multiplexer 378 as the fourth input to LUT 362. Thus, both LUTs 362 and 366 receive the first, second and third inputs at their A, B, and C inputs and multiplexer 410 is programmed to select the fourth input and provide it to the control input of multiplexer 398.

According to well-known Boolean logic techniques and the Shannon Expansion, connecting three-input LUTs 362 and 366 in this manner will simulate a single four-input LUT with the result being generated at the output of multiplexer 398. The output of multiplexer 398 can be provided to the JPO output of LUB 358 by way of multiplexer 402 or to the Y output of LUB 358 by way of the multiplexers 394 and 402.

Figure 6:
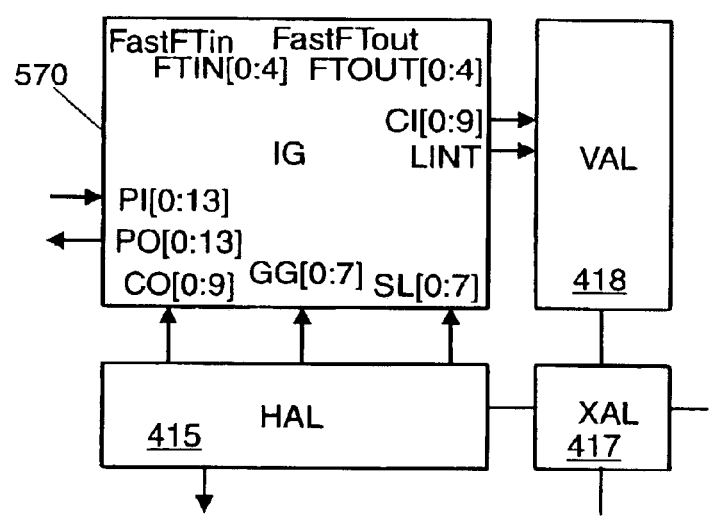
FIG. 6 is a schematic illustrating an interface group.

FIG. 6 illustrates a more detailed view of the routing resources adjacent to IGchan 286 of FIG. 2. Vertical bus (VAL) 418 and horizontal bus (HAL) 415 are shown adjacent to the IGchan 414. Positioned diagonal to Igchan 414 is cross-bus (XAL) 417. IGchan 414 has the following inputs: PI[0:13], CO[0:9], GG[0:7], SL[0:7] and the following outputs: PO[0:13], LINT, and CI[0:9]. The CO[0:9], GG[0:7], and SL[0:7] inputs are coupled to HAL bus 415. The CI[0:9] and LINT outputs are coupled to the VAL bus 418.

Figure 7:
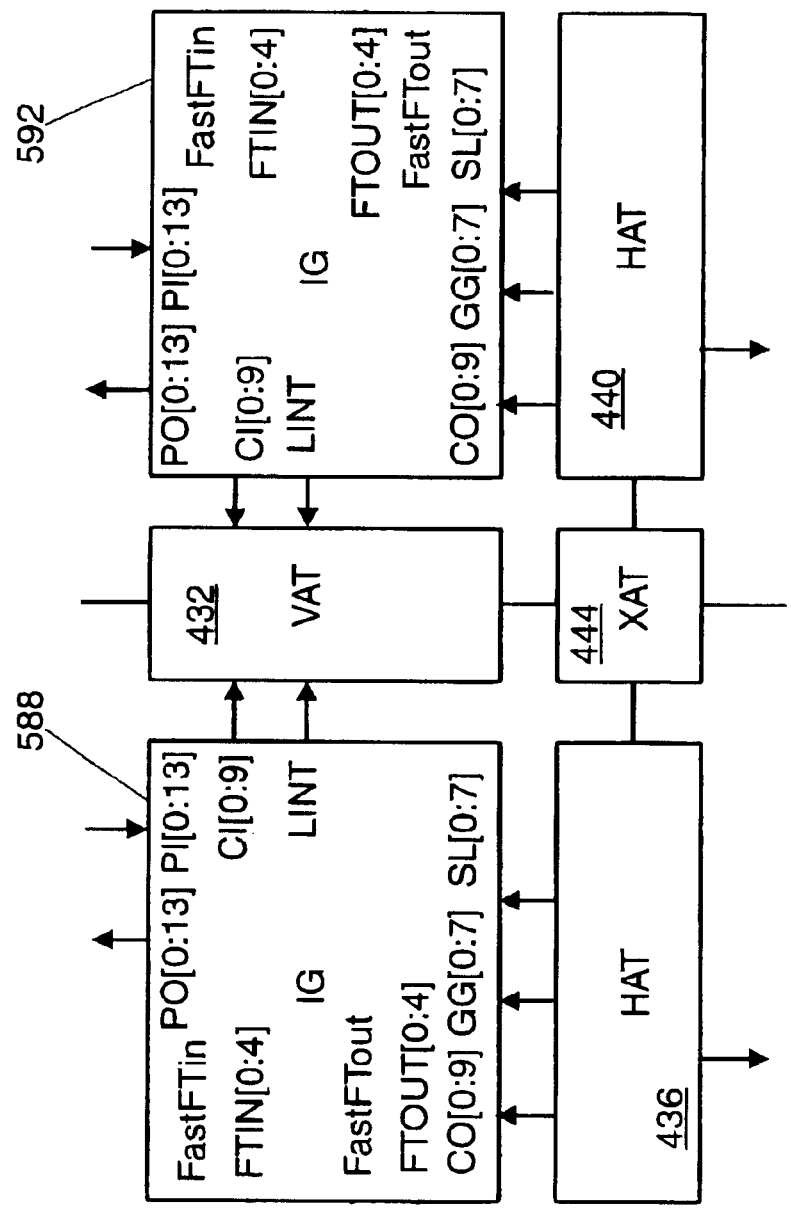
FIG. 7 is a schematic illustrating two side-by-side interface groups.

FIG. 7 illustrates a more detailed view of a typical IG×2 as first shown in FIG. 2. The IG×2 420 has two IGs 424 and 428. Between IGs 424 and 428 is vertical bus VAT 432. Below and adjacent to each of IGs 424 and 428 are horizontal busses HAT 436 and 440. Adjacent to VAT 432 and HAT busses 436 and 440 is cross bus XAT 444. Each of IGs 424 and 428 has outputs PO[0:13], CI[0:9], and LINT. Each of IGs 424 and 428 has inputs PI[0:13], CO[0:9], GG[0:7], and SL[0:7].

Figure 8A:
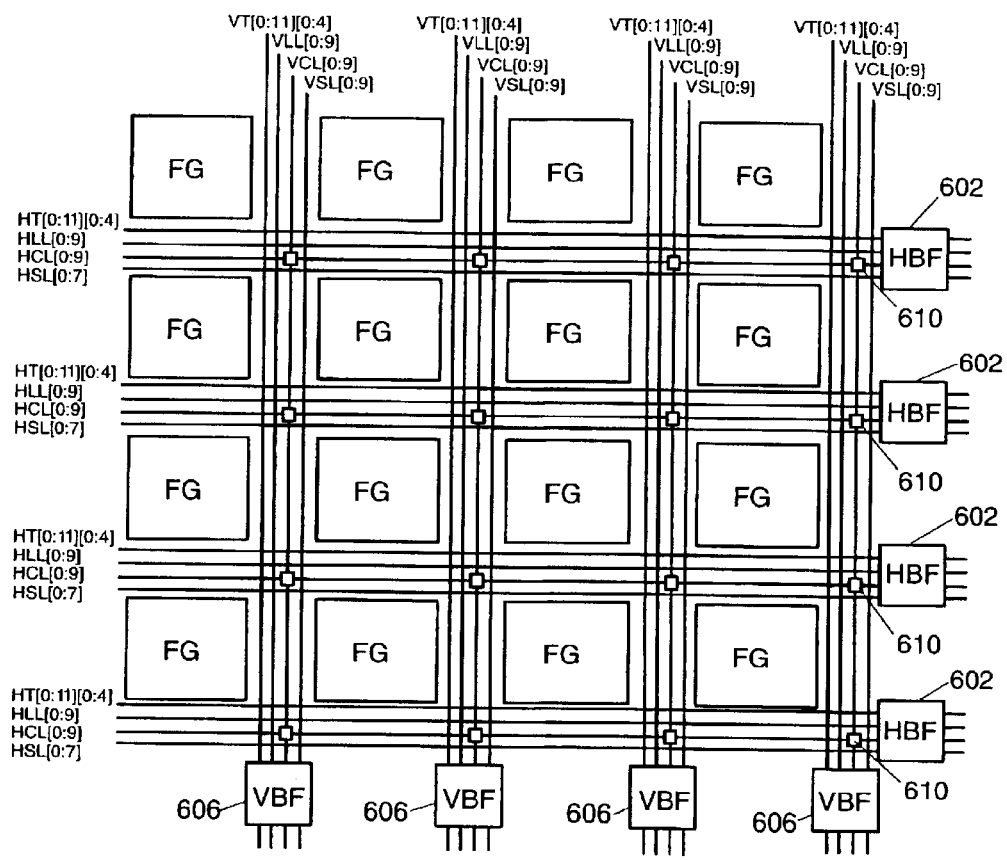
FIG. 8a is a schematic illustrating the horizontal intra-tile buffers and the vertical intra-tile buffers on a portion of one field programmable gate array tile.

FIG. 8a illustrates a portion of the plurality of functional groups comprising a FPGA tile, see FIG. 2. Intra-tile horizontal buffers ("HBF") 602 are horizontally spaced apart by four functional groups. Intra-tile vertical buffers ("VBF") 606 are vertically spaced apart by four functional groups. Other spacing for the tile buffers may be used depending on design requirements. Horizontal routing resources HT[0:11] [0:4], HLL[0:9], HCL[0:9], and HSL[0:7] are buffered at HBF 602.

Vertical routing resources VT[0:11] [0:4], VLL[0:9], VCL [0:9], and VSL [0:7] are buffered at VBF 606. Details of HBF 602 and VBF 606 are illustrated below.

A primary routing structure comprises the horizontal routing resources and the vertical routing resources. The routing resources VCL[0:9] and HCL[0:9] intersect at programmable interconnect 610.

Figure 8B:
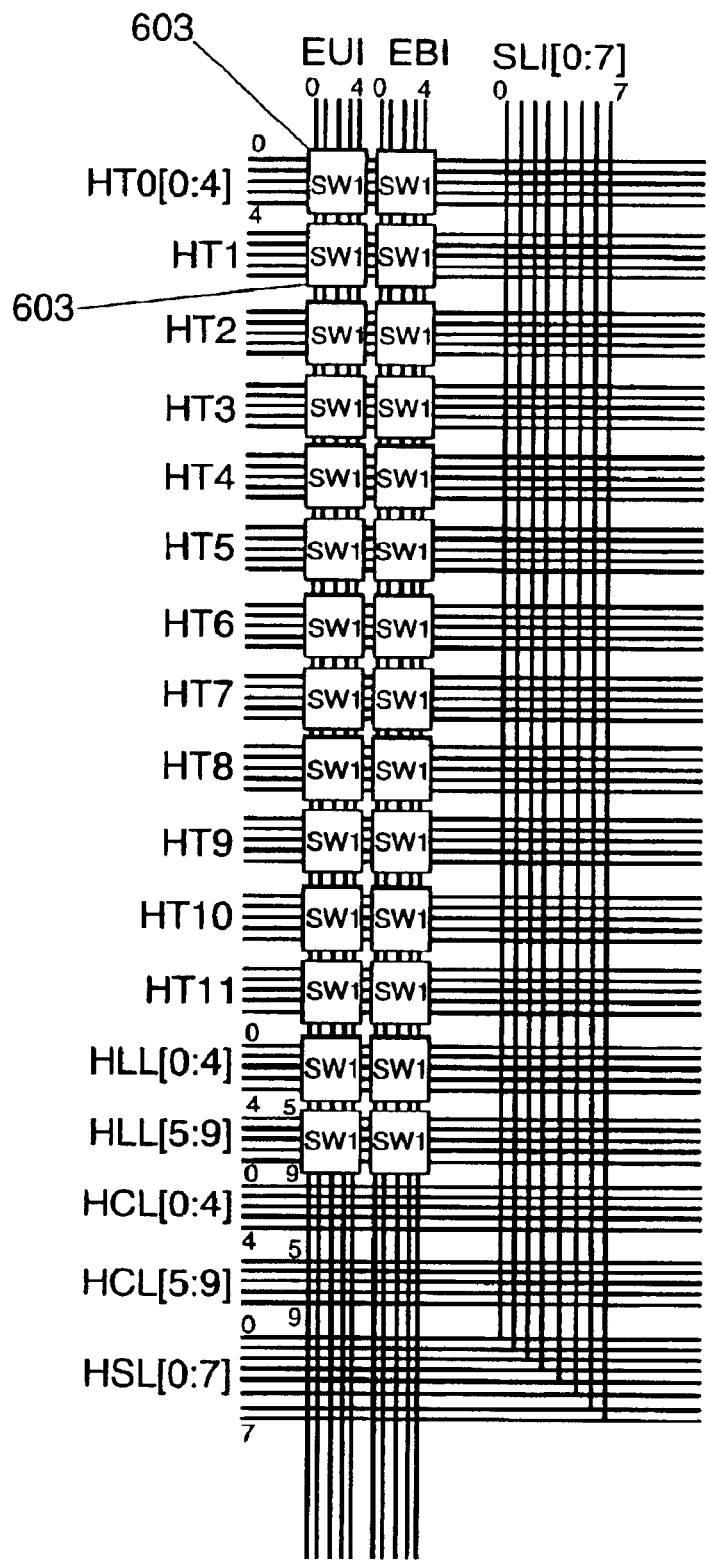
FIG. 8b is a schematic illustrating routing resources between functional groups.

FIG. 8b is a schematic illustrating routing resources between functional groups. Routing resource HT[0:11] [0:4] is shown as 12 (0 through 11) sets of 5 (0 through 4) routing resources. HT[0:11] [0:4] intersect the routing resource EUI and EBI at SW1 603. Routing resources EUI and EBI connect to functional groups, for example functional groups 294 and 298 in FIG. 3. Routing resources HLL[0:9], HCL [0:9] and HSL[0:7] are also shown. HSL[0:7] is coupled to routing resource SLI[0:7]. Each SW1 603 comprises programmable interconnects. In one embodiment, functional groups may transmit data to each other with EUI and EBI routing resources and through HLL[0:9] routing resources, as indicated by programmable interconnects 603 at the intersection of EUI, EBI and HLL[0:9] routing resources.

FIG. 9a is a schematic illustrating programmable interconnect 610 between VCL[0:9] and HCL[0:9], see FIG. 8a. HCL[0] intersects with VCL[0], HCL[1] intersects with VCL[1], HCL[2] intersects with VCL[2], and so on, until HCL[9] intersects with VCL[9].

FIG. 9b is a schematic illustrating intersection points 608 from FIG. 9a. Each programmable interconnect in intersection point 608 from FIG. 9a comprising vertical track 611 driving horizontal track 613 with three-state buffer 609.

FIG. 10a is a schematic illustrating a more detailed view of HBF 602 from FIG. 8a. Each of the HT[0:11] [0:4], HSL[0:7] and HLL[0:9] tracks are segmented by buffer 614. However, the HCL[0:9] tracks do not have a buffer that segments them. Buffer 618 couples together each of the HCL[0:9] with each of the HLL[0:9] tracks. For example, HLL[0] is segmented by buffer 614 and coupled through buffer 618 to HCL[0], which is not segmented. HLL[1] is segmented by buffer 614 and coupled through buffer 618 to HCL[1], which is not segmented, and so on, until HLL[9] is segmented by buffer 614 and coupled through buffer 618 to HCL[9], which is not segmented.

Because the HCL tracks are coupled in this way to a buffer, the HCL tracks may be referred to as a non-segmented, horizontal bus. The HLL may be referred to as the segmented, horizontal bus due to the buffer. Vertical buffers 618 also comprise the three-state bi-directional transistor configuration shown in FIG. 10b.

FIG. 10b is a schematic illustrating three-state, bi-directional transistor configuration 619. Configuration 619 represents buffers 614 and 618 from FIG. 10a. Configuration 619 isolates signals on one side of the configuration from signals on the other side, allowing a single line to behave as if it were two separate lines.

FIG. 11a is a schematic illustrating a more detailed view of VBF 606 in FIG. 8a. Each of the VT [0:11] [0:4], VSL[0:7] and VLL[0:9] tracks are segmented by bi-directional buffer 622. However, the VCL[0:9] tracks do not have a buffer that segments them. Buffer 626 couples together each of the VCL[0:9] with each of the VLL[0:9] tracks. For example, VLL[0] is segmented by buffer 622 and coupled through buffer 626 to VCL[0], which is not segmented. VLL[1] is segmented by buffer 622 and coupled through buffer 626 to VCL[1], which is not segmented, and so on, until VLL[9] is segmented by buffer 622 and coupled through buffer 626 to VCL[9], which is not segmented.

Because the VCL tracks are coupled in this way to a buffer, the VCL tracks may be referred to as a non-segmented, vertical bus. The VLL tracks may be referred to as the segmented, vertical bus due to the buffer. Each of buffers 626 also comprises a three-state bi-directional transistor configuration illustrated in FIG. 11b.

FIG. 11b is a schematic illustrating three-state, bi-directional transistor configuration 639. Configuration 639 represents buffers 622 and 626 from FIG. 11a. Configuration 639 isolates signals on one side of the configuration from signals on the other side, allowing a single line to behave as if it were two separate lines.

Functional groups are separated from one another by horizontal buses HA and vertical buses VA (see FIG. 3). Cross bus XA connects VA and HA buses with routing resources HT[0:11] [0:4], HSL[0:7], HLL[0:9], HCL[0:9], VT[0:11] [0:4], VSL[0:7], VLL[0:9], and VCL[0:9]. Within a FPGA tile, in one embodiment every fourth functional group is separated from the next four functional groups by a buffer, in both the horizontal and vertical directions (see FIG. 8a). A matrix comprised of N-by-N functional groups defines a local signaling group within which signals may be transmitted, between functional groups, over one or both of HLL[0:9] and HCL[0:9] for horizontal transmissions and one or both of VLL[0:9] and VCL[0:9] for vertical transmissions, or a combination of horizontal and vertical transmission.

Signals may be transmitted between functional groups when the functional groups are not in one local signaling group by using routing resources HCL[0:9] and VCL[0:9] (see FIGS. 10a and 11a). Routing resources HCL[0:9] and VCL[0:9] are not segmented by buffers HBF and VBF, respectively, therefore signaling between local signaling groups may occur over those resources.

The routing interconnect areas includes transistor switches and memory cells at many intersections of signal lines, but not at all intersections. From this disclosure, it will be apparent to persons of ordinary skill in the art, however, that the specific number of lines in any of the routing buses may vary in accordance with the present disclosed system. Furthermore, it should be well understood that the specific number of lines in any of the signal buses may vary in accordance with the present disclosed system.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. An intra-tile buffering system for a field programmable gate array, wherein said field programmable gate array includes:
   a plurality of rows and a plurality of columns, wherein each of said plurality of rows has a left end and a right end, and each said plurality of columns has a top end and a bottom end, and wherein each of said plurality of rows comprises a plurality of functional groups aligned from said left end to right end with an interface group located at said right end and said left end, and each of said plurality of columns comprises a plurality of functional groups aligned from top end to bottom end with an interface group located at said top end and said bottom end;
   wherein each functional group is configured to receive a primary input signal, perform a logic operation, and generate a primary output signal; and
   wherein each interface group is configured to transfer signals from each of said plurality of functional groups connected to said interface group to outside of said at least one field programmable gate array tile, and includes a plurality of input multiplexers configured to select signals received from outside of said at least one field programmable gate array tile and provide signals to each of said plurality of functional groups connected to said interface group, said intra-tile buffering structure comprising:
      a primary routing structure coupled to said functional groups and interface groups and configured to route signals within said at least one field programmable gate array tile, between said plurality of functional groups and said interface groups;
      wherein said primary routing structure comprises:
         a horizontal bus coupled to each of said plurality of rows of functional groups;
         a vertical bus coupled to each of said plurality of columns of functional groups;
         a horizontal buffer coupled to each horizontal bus and spaced every Nth of said plurality of columns of functional groups, where N is an integer; and
         a vertical buffer coupled to each vertical bus and spaced every Mth said plurality of rows of functional groups, where M is an integer.

2. The intra-tile buffering system of claim 1, said horizontal bus further comprising a segmented, horizontal bus and a non-segmented, horizontal bus.

3. The intra-tile buffering system of claim 2, wherein said horizontal, non-segmented bus is configurable to transfer signals from one of the plurality of functional groups in said one of said plurality of rows connected to said horizontal bus and a first one of said plurality of columns through the horizontal buffer and to another of the plurality of functional groups in said one of said plurality of rows and a second one of said plurality of columns.

4. The intra-tile buffering system of claim 2, wherein said horizontal, segmented bus is configurable to transfer signals from one of the plurality of functional groups in said one of said plurality of rows connected to said horizontal bus and a first one of said plurality of columns directly to another of the plurality of functional groups in said one of said plurality of rows connected to said horizontal bus and a first one of said plurality of columns.

5. The intra-tile buffering system of claim 3, said horizontal buffer comprises a first bi-directional three-state buffer that couples to said segmented, horizontal bus.

6. The intra-tile buffering system of claim 5, said horizontal buffer further comprising a second bi-directional three-state buffer that couples to said horizontal, segmented bus and to said horizontal, non-segmented bus.

7. The intra-tile buffering system of claim 6, wherein N equals 4.

8. The intra-tile buffering system of claim 7, wherein M equals 4.

9. The intra-tile buffering system of claim 1, said vertical bus further comprising a segmented, vertical bus and a non-segmented, vertical bus.

10. The intra-tile buffering system of claim 9, wherein said vertical, non-segmented bus is configurable to transfer signals from one of the plurality of functional groups in said one of said plurality of columns connected to said vertical bus and a first one of said plurality of rows through the vertical buffer and to another of the plurality of functional groups in said one of said plurality of columns connected to said vertical bus and a second one of said plurality of rows.

11. The intra-tile buffering system of claim 10, said vertical buffer comprises a first bi-directional three-state buffer that couples to said segmented, vertical bus.

12. The intra-tile buffering system of claim 11, said vertical buffer further comprising a second bi-directional three-state buffer that couples to said vertical, segmented bus and to said vertical, non-segmented bus.

13. The intra-tile buffering system of claim 12, wherein N equals 4.

14. The intra-tile buffering system of claim 13, wherein M equals 4.

15. The intra-tile buffering system of claim 12, said horizontal bus further comprising a segmented, horizontal bus and a non-segmented, horizontal bus, wherein said horizontal, non-segmented bus is configurable to transfer signals from one of the plurality of functional groups in said one of said plurality of rows connected to said horizontal bus and a first one of said plurality of columns through the horizontal buffer and to another of the plurality of functional groups in said one of said plurality of rows and a second one of said plurality of columns.

16. The intra-tile buffering system of claim 1, said vertical bus further comprising a segmented, vertical bus and a non-segmented, vertical bus and said horizontal bus further comprising a segmented, horizontal bus and a non-segmented, horizontal bus.

17. The intra-tile buffering system of claim 16, wherein said horizontal, segmented bus is configurable to transfer signals from one of the plurality of functional groups n said one of said plurality of rows connected to said horizontal bus and a first one of said plurality of columns directly to another of the plurality of functional groups in said one of said plurality of rows connected to said horizontal bus and a first one of said plurality of columns.

18. The intra-tile buffering system of claim 16, further comprising a programmable interconnect coupling together said horizontal, non-segmented bus and said vertical, non-segmented bus.

19. The intra-tile buffering system of claim 18 wherein said horizontal, non-segmented bus is configured to transfer signals from one of said plurality of functional groups in said one of said plurality of rows connected to said horizontal bus and a first one of said plurality of columns through the horizontal buffer and to another of the plurality of functional groups in said one of said plurality of rows and a second one of said plurality of columns.

20. The intra-tile buffering system of claim 19 wherein said vertical, non-segmented bus is configured to transfer signals from one of said plurality of functional groups in said one of said plurality of columns connected to said vertical bus and a first one of said plurality of rows through the vertical buffer and to another of the plurality of functional groups in said one of said plurality of columns connected to said vertical bus and a second one of said plurality of rows.

21. The intra-tile buffering system of claim 20, wherein N equals 4.

22. The intra-tile buffering system of claim 21, wherein M equals 4.

* * * * *